United States Patent
Olsen et al.

(10) Patent No.: US 7,910,497 B2
(45) Date of Patent: Mar. 22, 2011

(54) METHOD OF FORMING DIELECTRIC LAYERS ON A SUBSTRATE AND APPARATUS THEREFOR

(75) Inventors: Christopher S. Olsen, Fremont, CA (US); Tejal Goyani, Sunnyvale, CA (US); Johanes Swenberg, Los Gates, CA (US)

(73) Assignee: Applied Materials, Inc., Santa Clara, CA (US)

(*) Notice: Subject to any disclaimer, the term of this patent is extended or adjusted under 35 U.S.C. 154(b) by 168 days.

(21) Appl. No.: 11/830,143

(22) Filed: Jul. 30, 2007

(65) Prior Publication Data

US 2009/0035927 A1 Feb. 5, 2009

(51) Int. Cl.
*H01L 21/469* (2006.01)

(52) U.S. Cl. ............... 438/779; 438/474; 257/E21.143; 257/E21.311

(58) Field of Classification Search .......... 438/779
See application file for complete search history.

(56) References Cited

U.S. PATENT DOCUMENTS

| | | | | |
|---|---|---|---|---|
| 4,799,773 | A * | 1/1989 | Sterling | 349/27 |
| 6,025,281 | A * | 2/2000 | Passlack et al. | 438/779 |
| 6,028,012 | A * | 2/2000 | Wang | 438/779 |
| 6,291,867 | B1 * | 9/2001 | Wallace et al. | 257/410 |
| 6,638,859 | B2 | 10/2003 | Sneh et al. | |
| 6,682,973 | B1 * | 1/2004 | Paton et al. | 438/240 |
| 6,723,642 | B1 * | 4/2004 | Lim et al. | 438/680 |
| 6,790,755 | B2 * | 9/2004 | Jeon | 438/591 |
| 6,858,547 | B2 * | 2/2005 | Metzner et al. | 438/785 |
| 6,921,702 | B2 * | 7/2005 | Ahn et al. | 438/287 |
| 6,930,060 | B2 * | 8/2005 | Chou et al. | 438/786 |
| 6,933,245 | B2 * | 8/2005 | Lee et al. | 438/778 |
| 7,056,835 | B2 * | 6/2006 | Pomarede et al. | 438/769 |
| 7,153,745 | B2 * | 12/2006 | Cho et al. | 438/270 |
| 7,205,186 | B2 * | 4/2007 | Wang et al. | 438/197 |
| 7,385,265 | B2 * | 6/2008 | Manabe et al. | 257/410 |
| 7,396,779 | B2 * | 7/2008 | Forbes | 438/784 |
| 2002/0168869 | A1 * | 11/2002 | Chang et al. | 438/769 |
| 2003/0148632 | A1 * | 8/2003 | Chen | 438/783 |
| 2004/0235311 | A1 * | 11/2004 | Nakanishi et al. | 438/775 |
| 2005/0085092 | A1 * | 4/2005 | Adetutu et al. | 438/763 |
| 2005/0106849 | A1 * | 5/2005 | Gwo | 438/602 |
| 2005/0106896 | A1 * | 5/2005 | Fukuchi | 438/778 |
| 2005/0260347 | A1 * | 11/2005 | Narwankar et al. | 427/248.1 |
| 2006/0145254 | A1 * | 7/2006 | Buh et al. | 257/344 |
| 2006/0246739 | A1 | 11/2006 | Wang et al. | |
| 2007/0128775 | A1 * | 6/2007 | Jeon et al. | 438/149 |
| 2007/0218623 | A1 * | 9/2007 | Chua et al. | 438/240 |
| 2007/0238316 | A1 * | 10/2007 | Ohashi | 438/775 |
| 2007/0264776 | A1 * | 11/2007 | Dong et al. | 438/257 |
| 2008/0014759 | A1 * | 1/2008 | Chua et al. | 438/763 |
| 2008/0026553 | A1 * | 1/2008 | Chua et al. | 438/591 |
| 2008/0032509 | A1 * | 2/2008 | Ohashi et al. | 438/763 |
| 2008/0119057 | A1 * | 5/2008 | Chua et al. | 438/763 |
| 2008/0251836 | A1 * | 10/2008 | Park | 257/324 |

\* cited by examiner

*Primary Examiner* — N. Drew Richards
*Assistant Examiner* — Jae Lee
(74) *Attorney, Agent, or Firm* — Moser IP Law Group

(57) ABSTRACT

Methods of forming dielectric layers on a substrate comprising silicon and oxygen are disclosed herein. In some embodiments, a method of forming a dielectric layer on a substrate includes provide a substrate having an exposed silicon oxide layer; treating an upper surface of the silicon oxide layer with a plasma; and depositing a silicon nitride layer on the treated silicon oxide layer via atomic layer deposition. The silicon nitride layer may be exposed to a plasma nitridation process. The silicon oxide and silicon nitride layers may be subsequently thermally annealed. The dielectric layers may be used as part of a gate structure.

22 Claims, 4 Drawing Sheets

METHOD OF FORMING DIELECTRIC LAYERS ON A SUBSTRATE AND APPARATUS THEREFOR

BACKGROUND OF THE INVENTION

1. Field of the Invention

Embodiments of the present invention generally relate to semiconductor processing, and more specifically, to methods for fabricating dielectric materials on a substrate.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. A CMOS transistor comprises a gate structure disposed between source and drain regions that are formed in the substrate. The gate structure generally comprises a gate electrode and a gate dielectric layer. The gate electrode is disposed over the gate dielectric layer to control a flow of charge carriers in a channel region formed between the drain and source regions beneath the gate dielectric layer.

Some exemplary applications of CMOS transistors include logic and flash memory applications. In such applications, gate stacks may have varying gate electrode over gate dielectric structures, such as SONOS, SANOS, TANOS, or the like. For example, SONOS stacks include layers, from top to bottom, of silicon (or polysilicon), silicon oxide, silicon nitride, silicon oxide, and silicon; SANOS stacks include layers, from top to bottom, of silicon (or polysilicon), aluminum oxide, silicon nitride, silicon oxide, and silicon; and TANOS stacks include layers, from top to bottom, of tantalum nitride, aluminum oxide, silicon nitride, silicon oxide, and silicon.

In each of the above applications, a silicon nitride layer is formed over a silicon oxide layer. The silicon nitride layer may be formed by such techniques as chemical vapor deposition (CVD), atomic layer deposition (ALD), or the like. However, CVD processes typically result in poor roughness of the surface, leading to process and or device performance variability. In addition, ALD processes typically have deposition initiation and incubation problems, resulting in poor film quality, reduced initial deposition rates, and high process variability.

Therefore, there is a need for an improved method of forming gate dielectric layers on a substrate for field effect transistors.

SUMMARY OF THE INVENTION

Methods of forming dielectric layers on a substrate comprising silicon and oxygen are disclosed herein. In some embodiments, a method of forming a dielectric layer on a substrate includes provide a substrate having an exposed silicon oxide layer; treating an upper surface of the silicon oxide layer with a plasma; and depositing a silicon nitride layer on the treated silicon oxide layer via atomic layer deposition. The silicon nitride layer may be exposed to a plasma nitridation process. The silicon oxide and silicon nitride layers may be subsequently thermally annealed. The dielectric layers may be used as part of a gate structure.

In some embodiments, a method of forming a dielectric layer on a substrate includes providing a substrate comprising silicon; forming a silicon oxide layer on the substrate by annealing the substrate in an oxidizing atmosphere; treating an upper surface of the silicon oxide layer with a plasma; depositing a silicon nitride layer on the treated silicon oxide layer via atomic layer deposition; exposing the silicon nitride layer to a plasma; and annealing the silicon oxide and silicon nitride layers.

In some embodiments, a method of forming a gate structure on a substrate includes providing substrate having an exposed silicon oxide layer; treating an upper surface of the silicon oxide layer with a plasma; depositing a silicon nitride layer on the silicon oxide layer via atomic layer deposition; and forming a gate electrode layer above the silicon nitride layer.

In another aspect of the invention, apparatus for processing a substrate in accordance with embodiments of the invention are provided. In some embodiments. an apparatus for processing a substrate includes a vacuum substrate transfer chamber; a plurality of process chambers coupled to the vacuum substrate transfer chamber, wherein the plurality of process chambers comprise a chemical vapor deposition (CVD) chamber, a decoupled plasma nitridation (DPN) chamber, a rapid thermal process (RTP) chamber, and an atomic layer deposition (ALD) chamber; one or more load lock chambers coupled to the vacuum substrate transfer chamber; a robot disposed in the vacuum substrate transfer chamber for transferring substrates between the process chambers and the load lock chambers; and a system controller for controlling the operation of the apparatus.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally provide methods for fabricating dielectric materials used in a variety of applications, for example, as a gate dielectric layer used in field effect transistors fabrication. In some embodiments improved methods of forming a silicon nitride film be atomic layer deposition (ALD) is provided. ALD nitride layers formed in accordance with embodiments of the present invention may have improved deposition rates and/or film quality as compared to conventional ALD nitride layers. In some embodiments, the improved ALD nitride layer may form part of a gate dielectric stack, for example, for use in a transistor.

Figure 1:
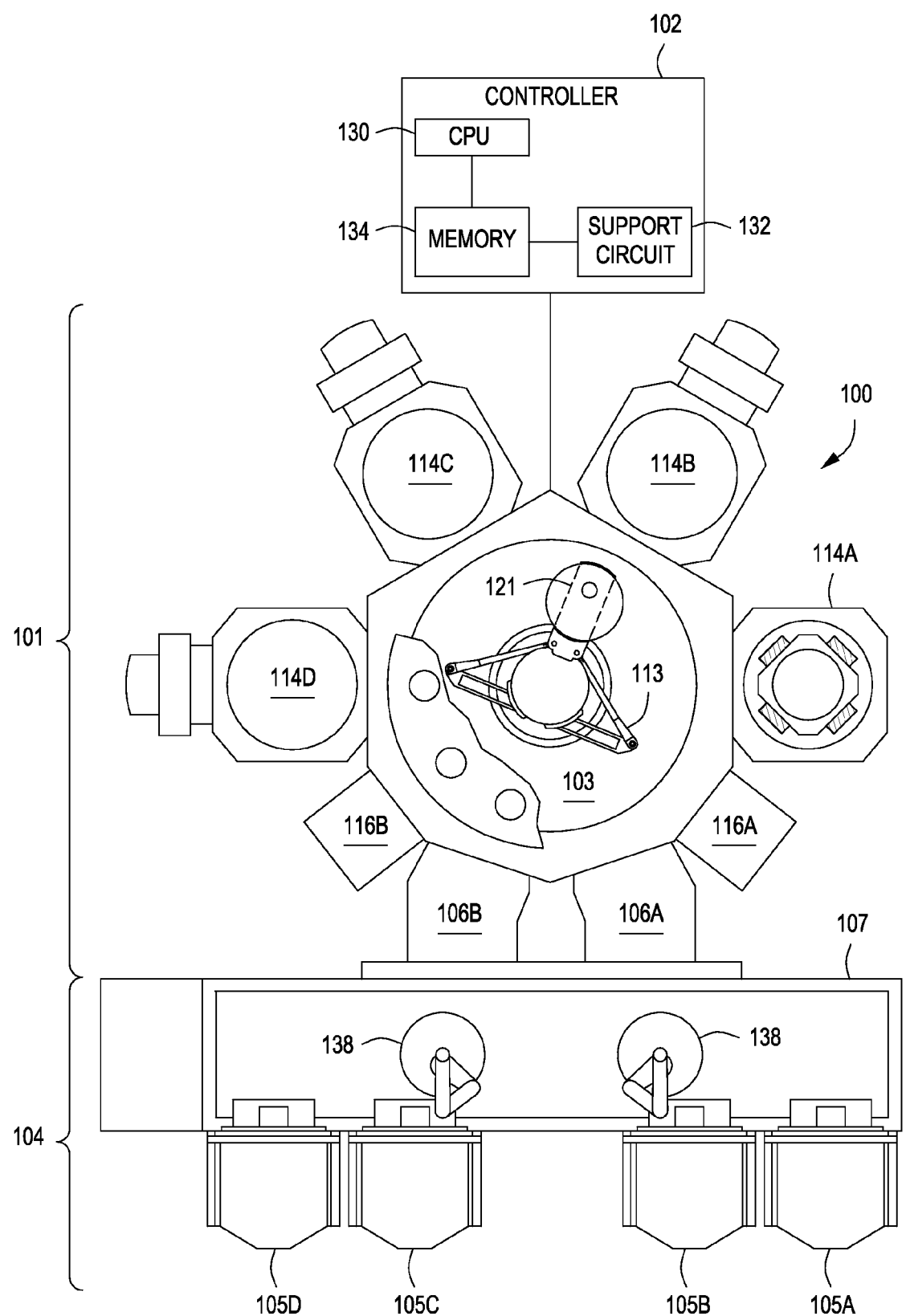
FIG. 1 illustrates a schematic diagram of an exemplary integrated semiconductor substrate processing system (e.g., a cluster tool) of the kind used in some embodiments of the invention.

FIG. 1 is a schematic view of an integrated tool 100 (e.g., a cluster tool) suitable for processing semiconductor substrates according to embodiments of the present invention. Examples of the integrated tool 100 include the CENTURA® and ENDURA® integrated tool, both available from Applied Materials, Inc., of Santa Clara, Calif. It is contemplated that the methods described herein may be practiced in other tools having suitable process chambers coupled thereto.

The tool 100 includes a vacuum-tight processing platform 101, a factory interface 104, and a system controller 102. The platform 101 comprises a plurality of processing chambers 114A-D coupled to a vacuum substrate transfer chamber 103. The factory interface 104 is coupled to the transfer chamber 103 by one or more load lock chambers (two load lock chambers 106A-B shown in FIG. 1).

In some embodiments, the factory interface 104 comprises at least one docking station 107, at least one factory interface robot 138 to facilitate transfer of substrates. The docking station 107 is configured to accept one or more front opening unified pod (FOUP). Four FOUPS 105A-D are shown in the embodiment of FIG. 1. The factory interface robot 138 is configured to transfer the substrate from the factory interface 104 to the processing platform 101 for processing through the loadlock chambers 106A-B. Each of the loadlock chambers 106A-B have a first port coupled to the factory interface 104 and a second port coupled to the transfer chamber 103. The loadlock chamber 106A-B are coupled to a pressure control system (not shown) which pumps down and vents the chambers 106A-B to facilitate passing the substrate between the vacuum environment of the transfer chamber 103 and the substantially ambient (e.g., atmospheric) environment of the factory interface 104. The transfer chamber 103 has a vacuum robot 113 disposed therein. The vacuum robot 113 is capable of transferring substrates 121 between the loadlock chamber 106A-B and the processing chambers 114A-D.

In some embodiments, the processing chambers coupled to the transfer chamber 103 may be a chemical vapor deposition (CVD) chamber 114D a Decoupled Plasma Nitridation (DPN) chamber 114C, a Rapid Thermal Process (RTP) chamber 114B, and an atomic layer deposition (ALD) chamber 114A. Alternatively, different processing chambers, including at least one ALD, CVD, metalorganic CVD (MOCVD), physical vapor deposition (PVD), decoupled plasma nitridation (DPN), or RTP chamber, may be interchangeably incorporated into the integrated tool 100 in accordance with process requirements. Suitable ALD, CVD, PVD, DPN, RTP, and MOCVD processing chambers are available from Applied Materials, Inc., among other manufacturers.

In some embodiments, one or more optional service chambers (shown as 116A-B) may be coupled to the transfer chamber 103. The service chambers 116A-B may be configured to perform other substrate processes, such as degassing, orientation, cool down and the like.

The system controller 102 is coupled to the integrated processing tool 100. The system controller 102 controls the operation of the tool 100 using a direct control of the process chambers 114A-D of the tool 100 or alternatively, by controlling the computers (or controllers) associated with the process chambers 114A-D and tool 100. In operation, the system controller 102 enables data collection and feedback from the respective chambers and system to optimize performance of the tool 100. The system controller 102 generally includes a central processing unit (CPU) 130, a memory 134, and support circuit 132. The CPU 130 may be one of any form of a general purpose computer processor that can be used in an industrial setting. The support circuits 132 are conventionally coupled to the CPU 130 and may comprise cache, clock circuits, input/output subsystems, power supplies, and the like. Software routines, such as a method for gate dielectric layer deposition described below with reference to FIG. 2, when executed by the CPU 130, transform the CPU into a specific purpose computer (controller) 102. The software routines may also be stored and/or executed by a second controller (not shown) that is located remotely from the tool 100.

Figure 2:
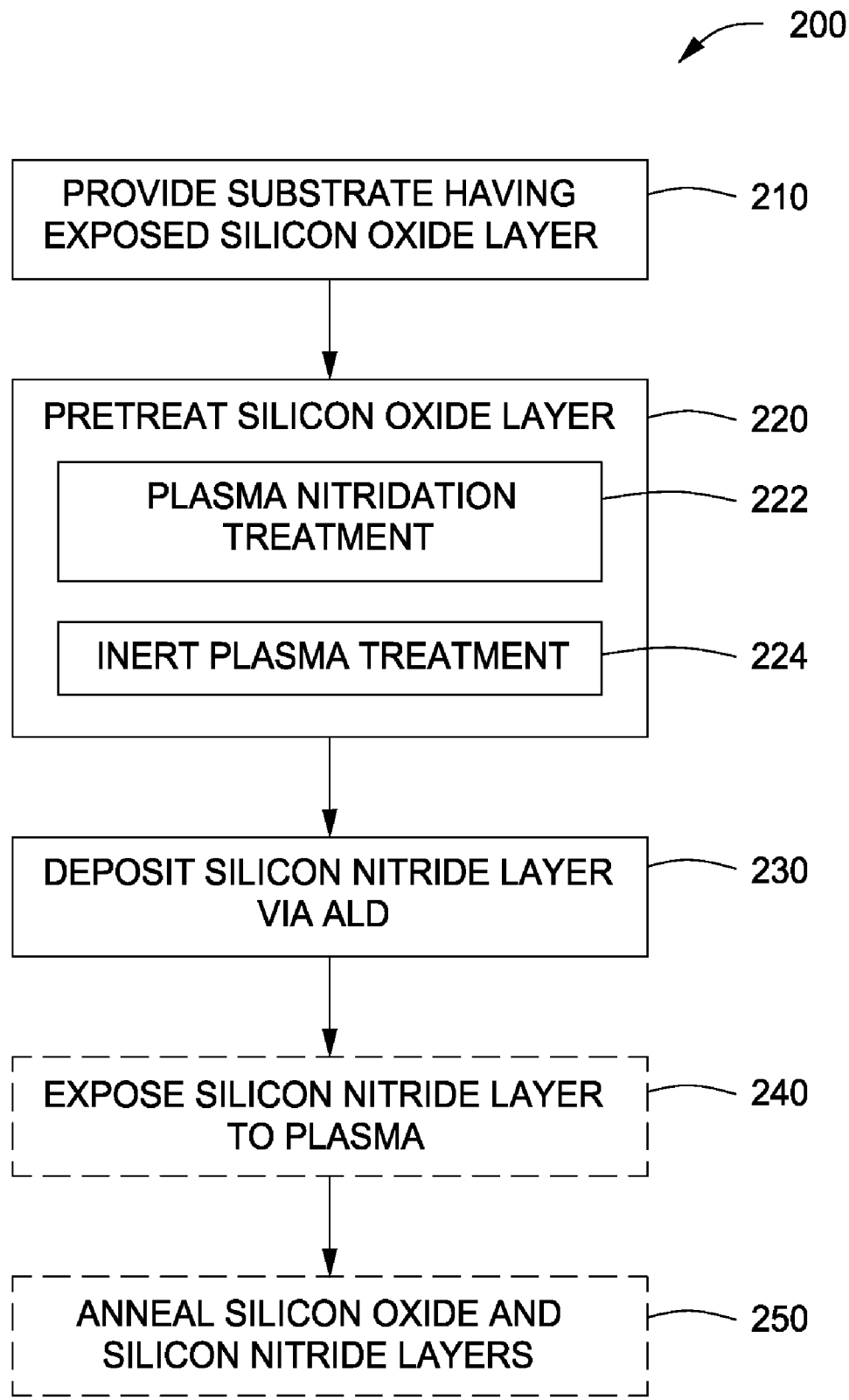
FIG. 2 illustrates a flow chart of an exemplary process for forming gate dielectric layers on a substrate in accordance with some embodiments of the invention.

FIG. 2 illustrates a process flow chart of one embodiment of a process 200 for forming gate dielectric layers on a substrate in an integrated cluster tool, such as the tool 100 described above. It is contemplated that the method 200 may be performed in other suitable tools.

Figure 3A:
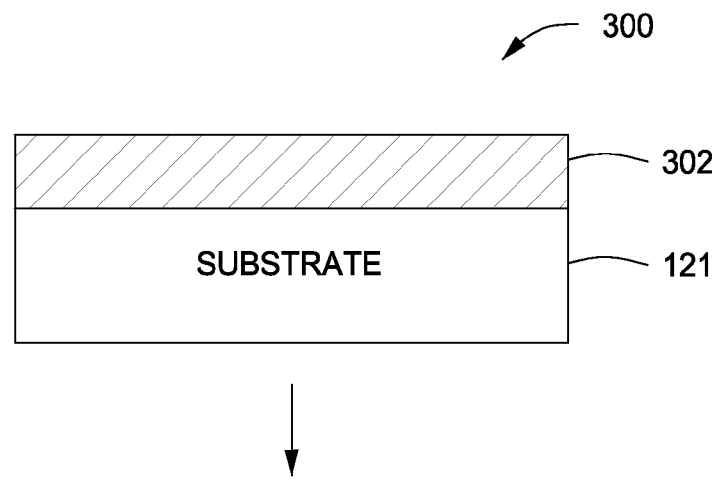
FIGS. 3A-G illustrate a substrate during various stages of the process sequence referred to in FIG. 2.

The method 200 begins at 210 by providing a substrate 121 having an exposed silicon oxide layer. The substrate 121, as shown in FIG. 3A, refers to any substrate or material surface upon which film processing is performed. For example, the substrate 121 may be a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. The substrate 121 may have various dimensions, such as 200 mm or 300 mm diameter wafers, as well as rectangular or square panels.

In some embodiments, a native oxide layer 302 may be disposed upon the substrate 121. Accordingly, a precleaning process may be performed to remove the native oxide layer 302. In some embodiments, the precleaning process may be configured to cause compounds that are exposed on the surface of the substrate 121 to terminate in a functional group that may provide a base for an incoming chemical precursor to attach on the surface of the substrate 121. Suitable precleaning processes may also include exposing the surface of the substrate 121 to an RCA solution (SCI/SC2), an HF-last solution, peroxide solutions, acidic solutions, basic solutions, plasmas thereof, derivatives thereof or combinations thereof. Useful precleaning processes are described in commonly assigned U.S. Pat. No. 6,858,547 and co-pending U.S. patent application Ser. No. 10/302,752, filed Nov. 21, 2002, entitled, "Surface Pre-Treatment for Enhancement of Nucleation of High Dielectric Constant Materials," which are both incorporated herein by reference in their entirety.

In an exemplary embodiment of a precleaning process, the native oxide layer 302 may be removed by a wet-clean process, such as an HF-last solution. The wet-clean process may be performed in a TEMPEST™ wet-clean system, available from Applied Materials, Inc.

Figure 3B:
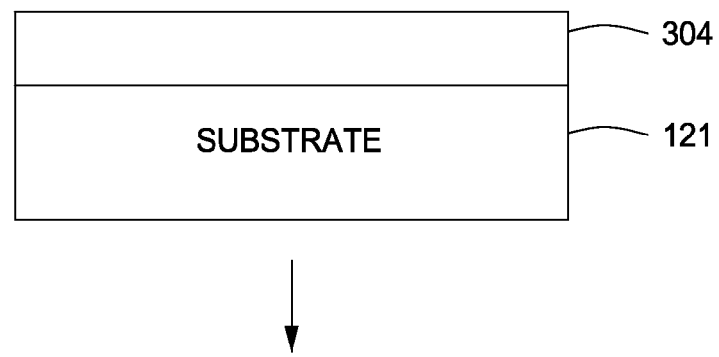

Optionally, providing a substrate 121 may further include forming a silicon oxide layer on the substrate 121, such as silicon oxide layer 304 shown in FIG. 3B. In some embodiments, the silicon oxide layer 304 may be formed by conducting a first annealing of a substrate comprising silicon in an oxidizing atmosphere to form a silicon oxide layer on the substrate. The silicon oxide layer 304 may be formed in one of the process chambers 114A-D of the tool 100. For example, the silicon oxide layer 304 may be formed by a rapid thermal process (RTP), chemical vapor deposition (CVD), rapid thermal-CVD (RT-CVD), plasma enhanced-CVD (PE-CVD), physical vapor deposition (PVD), atomic layer deposition (ALD), atomic layer epitaxy (ALE), or the like, or combinations thereof.

In some embodiments, the silicon oxide layer 304 is a thermal oxide layer deposited by an RTP process at a temperature between about 650 to about 980 degrees Celsius, or between about 750 to about 950 degrees Celsius. In some embodiments, the silicon oxide layer 304 may have a thickness of less than about 50 Å, or less than about 20 Å. In some embodiments, a process gas mixture including oxygen gas ($O_2$) may be supplied into the chamber between about 0.5 slm (standard liter per minute) to about 10 slm, such as about 2 slm. The process pressure may be regulated between about 0.5 Torr and about 750 Torr, such as about 2 Torr. The deposition process may be performed between about 5 seconds to about 30 seconds. One example of a suitable RTP process chamber used to deposit the silicon oxide layer 304 includes the RADIANCE® system available from Applied Materials, Inc., which may be one of the chambers 114A-D of the tool 100 as shown in FIG. 1.

Figure 3C:
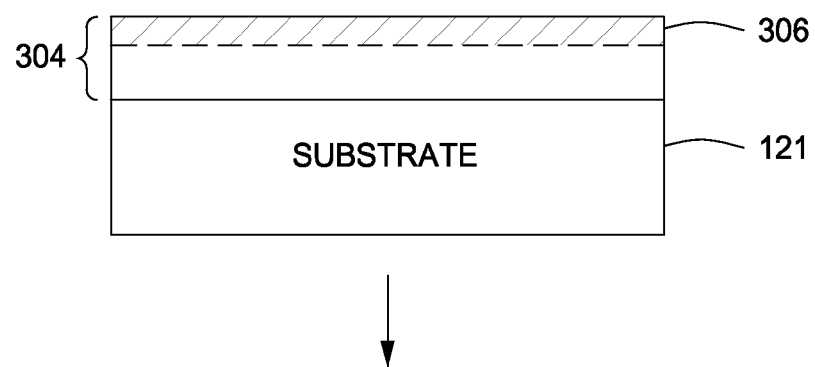

Next, at 220, the silicon oxide layer 304 may be pretreated with a plasma to form a plasma-treated layer 306, as depicted in FIG. 3C. The plasma-treated layer 306 has a modified bonding structure that facilitates improved deposition rates and film coverage of the silicon nitride layer subsequently formed by ALD. The plasma process may generally include a decoupled inert gas plasma process performed by flowing an inert gas into a decoupled plasma nitridation (DPN) chamber (i.e., a DPN chamber may be provided as one of chambers 114A-D in the tool 100) or a remote inert gas plasma process by flowing an inert gas into a process chamber equipped by a remote plasma system.

In some embodiments, the plasma treatment at 220 is performed in one of the chambers 114A-D that is configured as a DPN chamber. For example, a process 222 may be performed wherein the silicon oxide layer 304 is bombarded with ionic nitrogen formed by flowing nitrogen ($N_2$), ammonia ($NH_3$), or the like into the DPN chamber. The nitrogen gas flowed into the DPN chamber nitridizes the silicon oxide layer 304, forming the treated layer 306 on the upper surface of the silicon oxide layer 304.

Alternatively, a process 224 may be performed wherein the silicon oxide layer 304 is bombarded by a plasma formed from an inert gas such as argon (Ar), helium (He), krypton (Kr), neon (Ne), xenon (Xe), or the like, or combinations thereof. Optionally, one or more of the above inert gases may be included in the nitridation process 222.

In some embodiments, the nitrogen concentration on the treated silicon oxide layer 304 may be between about 0.1E15 atoms per square centimeter (at/cm$^2$) and about 3E15 atoms per square centimeter (at/cm$^2$).

In some embodiments, the plasma process proceeds for a time period from about 10 seconds to about 300 seconds, or from about 20 seconds to about 200 seconds, or from about 30 seconds to about 100 seconds. The plasma process may be conducted at a plasma power setting from about 100 to 700 Watts. Generally, the plasma process may be conducted in a continuous wave mode, or in a pulsed wave mode—having a duty cycle of as low as about 10 percent and at a pulse frequency of about 10 kHz. The DPN chamber may have a pressure between about 10 to 80 mTorr, or about 20 mTorr. The gas may have a flow rate of between about 10 standard cubic centimeters per minute (sccm) to about 5 standard liters per minute (slm), or between about 50 to 750 sccm, or between about 100 to 500 sccm.

Figure 3D:
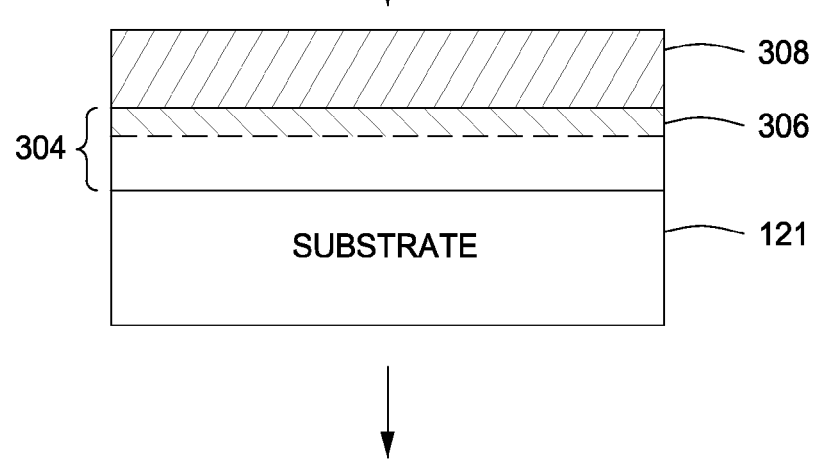

Next, at 230, a silicon nitride layer 308 is deposited on the pretreated silicon oxide layer 304, as shown in FIG. 3D, by an Atomic Layer Deposition Process. In some embodiments, the silicon nitride layer 308 is deposited to a thickness of less than about 10 Å to 80 Å, for example 50-60 Å for TANOS Flash memory applications and 10 Å to 20 Å for logic applications. For Logic, the silicon nitride layer 308 along with the silicon oxide layer 304 provides a low equivalent oxide thickness (EOT) unit opposed to conventional thermal oxide layers, thereby reducing gate leakage and increasing the stability and density of the dielectric materials. For TANOS Flash applications, the SiN layer is non-stoichiometric and often silicon (Si) rich in the 50-60% Si range, so that traps exist for storing charge in a nonvolatile memory (NVM) application such as SONOS, SANOS, and TANOS.

The silicon nitride deposition process may be performed in one of the process chambers 114A-D of the tool 100. One suitable process chamber that may be used to deposit silicon nitride layer 308 includes the Gemini system available from Applied Materials, Inc. In one embodiment, the silicon nitride layer 308 is deposited with an ALD process at a temperature from about 300 degrees Celsius to about 700 degrees Celsius, such as from about 500 degrees Celsius to about 700 degrees Celsius, and, for example, about 600 degrees Celsius. A process gas mixture including a nitrogen containing gas and a silicon containing gas, such as $SiH_4$, is supplied into the chamber. Suitable nitrogen containing gases include, but not limited to, $NH_3$, $N_2$, $N_2O$, and the like. Suitable silicon containing gases include, but not limited to, $SiH_4$, $Si_2H_6$, dichlorosilane (DCS), tetrachlorosilane (TCS), or hexachlorodisilane (HCD) and the like.

In some embodiments, the gas mixture may be supplied by a predetermined ratio of the nitrogen containing gas and silicon containing gas ranging between about 1:1 to about 1000:1 into the process chamber. In some embodiments, the gas mixture may be supplied by providing the nitrogen containing gas at a flow rate of between about 10 to 20,000 sccm, or between about 10 to 100 sccm, or about 25 sccm, and providing the silicon containing gas at a flow rate of between about 1 to 5000 sccm, or between about 1 to 500 sccm, or about 10 sccm. The process pressure may be regulated between about 0.5 to 50 Torr, or between about 1 to 25 Torr, or about 5 Torr. The deposition process may be cyclically performed, with cycle times between about 10 seconds to about 50 seconds.

Figure 3E:
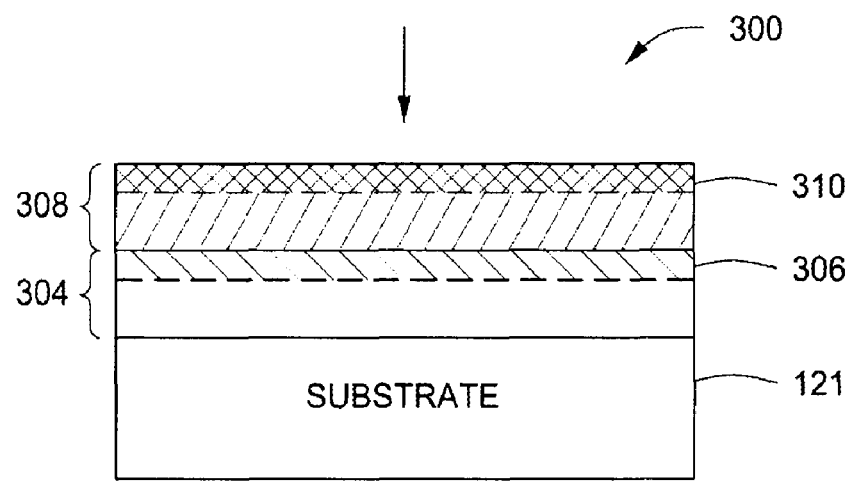

Optionally, at 240, the silicon nitride layer 308 may be exposed to a plasma in a plasma nitridation process that densifies the silicon nitride layer 308 and forms plasma-treated layer 310, as depicted in FIG. 3E. The plasma nitridation process at 240 may be substantially similar to the plasma treatment at 220 and may be performed in the same, or a similar, process chamber. For example, the plasma process at 240 may include a decoupled inert gas plasma process—performed by flowing an inert gas into a decoupled plasma nitridation (DPN) chamber (i.e., a DPN chamber 114A-D)—or a remote inert gas plasma process—by flowing an inert gas into a process chamber equipped by a remote plasma system, as described above with respect to 220.

Figure 3F:
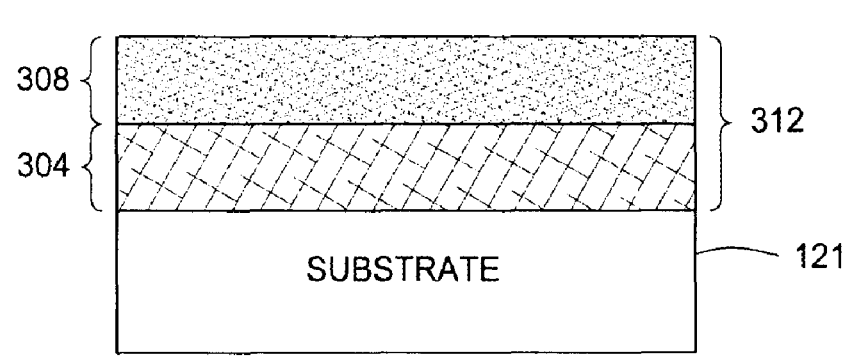

Optionally, at 250, the silicon oxide layer 304 and the silicon nitride layer 308 disposed on the substrate 121 may be exposed to a thermal annealing process for a logic process. The thermal annealing process at 250 converts the silicon oxide layer 304 and the silicon nitride layer 308 to a post anneal layer 312, as depicted in FIG. 3F. The thermal annealing process at 250 repairs any damage that may be caused by plasma bombardment by prior processes and reduces the fixed charge of the post anneal layer 312. An example of a suitable RTP chamber in which thermal annealing process at 250 may be performed is the CENTURA® RADIANCE™ RTP chamber, available from Applied Materials, Inc., among others. The thermal annealing process at 250 may be performed in one of the process chambers 114A-D described in FIG. 1.

In some embodiments, the substrate 121 may be heated to a temperature of between about 600 to 1,200 degrees Celsius. In some embodiments, the temperature may be between about 700 to 1,150 degrees Celsius, or between about 800 to 1,000 degrees Celsius. In some embodiments, the duration of the thermal annealing process may be between about 1 to 180 seconds, or between about 2 to 60 seconds, or between about 5 to 30 seconds. At least one annealing gas may be supplied into the chamber for the thermal annealing process. Examples of suitable annealing gases include oxygen ($O_2$), ozone ($O_3$), atomic oxygen (O), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), hydrazine ($N_2H_4$), or the like, or derivatives thereof, or combinations thereof. In some embodiments, the annealing gas may contain nitrogen and at least one oxygen-containing gas, such as oxygen ($O_2$). The chamber may have a pressure between about 0.1 to 100 Torr, or between about 0.1 to 50 Torr, or about 0.5 Torr.

In one example of a thermal annealing process, the substrate 121 may be heated to a temperature of about 1,000 degrees Celsius for about 15 seconds in an oxygen atmosphere. In another example, the substrate 121 may be heated to a temperature of about 1,100 degrees Celsius for between about 10 to 25 seconds in an atmosphere containing equivalent volumetric amounts of nitrogen and oxygen during the annealing process.

In some embodiments, the post anneal layer 312 may have a combined film thickness of the silicon nitride layer 308 and the silicon oxide layer 304 between about 10 to 30 Å. In some embodiments, the combined thickness may be between about 80 to 100 Å.

Figure 3G:
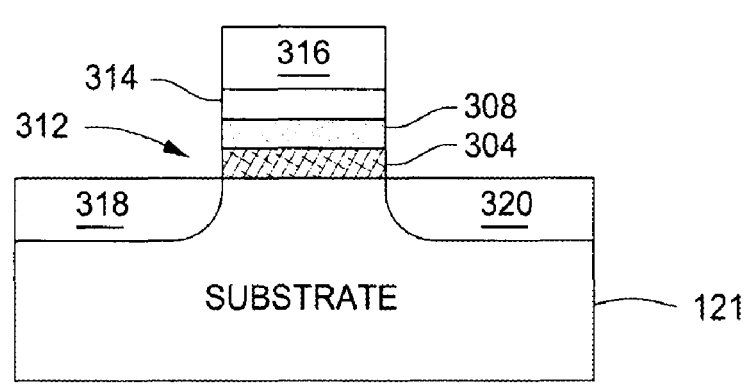

Upon completion of the silicon nitride deposition at 230, and optionally either or both of exposing the silicon nitride layer 308 to a plasma or annealing the silicon oxide and silicon nitride layers 304, 308, the method may end, or further processing of the substrate may continue, for example, to complete a gate structure 322 as shown in FIG. 3G. For example, the post anneal layer 312 may be utilized as a gate dielectric layer and a silicon oxide or aluminum oxide layer (oxide layer 314) may be formed over the post anneal layer 312 with a gate electrode layer 314 formed atop the oxide layer 314. The gate electrode layer 314 may comprise polysilicon (for example to form a SONOS or SANOS structure) or tantalum nitride (TaN) (for example to for a TANOS structure), or other suitable gate electrode materials. The layers 316, 314, 312 may then be etched to define the gate structure 322. Source and drain regions 318, 320 may be created in the substrate 121 by conventional ion implantation processes. Details of the various process steps, such as etching and ion implantation, carried out to form the gate structure 322 have been omitted for the sake of brevity.

Thus, methods for forming dielectric layers on a substrate have been provided. The improved dielectric materials may form part of a dielectric stack useful in various applications, such as a gate dielectric in a transistor. The gate dielectric stack may be utilized in various transistor technology applications, including such non-limiting examples as CMOS logic or flash memory applications having SONOS, SANOS, TANOS, or other film stacks. Although discussed above primarily in connection with forming a gate dielectric stack, embodiments of the present invention may generally be used for forming silicon nitride films over silicon oxide films via atomic layer deposition in other applications as well.

While the foregoing is directed to embodiments of the invention, other and further embodiments of the invention may be devised without departing from the basic scope thereof, and the scope thereof is determined by the claims that follow.

The invention claimed is:

1. A method of forming a dielectric layer on a substrate, comprising:
   providing a substrate having an exposed silicon oxide layer;
   treating an upper surface of the silicon oxide layer with a plasma;
   depositing a silicon nitride layer on the treated silicon oxide layer via atomic layer deposition at a temperature from about 300 degrees Celsius to about 700 degrees Celsius; and
   exposing the silicon nitride layer to a second plasma.

2. The method of claim 1, wherein providing a substrate having an exposed silicon oxide layer comprises:
   forming a silicon oxide layer on the substrate by annealing the substrate in an oxidizing atmosphere.

3. The method of claim 1, wherein treating an upper surface of the silicon oxide layer with a plasma comprises:
   exposing the upper surface of the silicon oxide layer to a plasma comprising nitrogen.

4. The method of claim 1, wherein treating an upper surface of the silicon oxide layer with a plasma comprises:
   exposing the upper surface of the silicon oxide layer to a plasma comprising an inert gas.

5. The method of claim 1, wherein treating an upper surface of the silicon oxide layer with a plasma comprises:
   exposing the upper surface of the silicon oxide layer to a plasma formed by a power supply operating in a pulsed wave mode and having a duty cycle as low as about 5 percent.

6. The method of claim 1, wherein the silicon nitride layer is deposited to a thickness of less than about 80 Å.

7. The method of claim 1, wherein the silicon nitride layer is deposited to a thickness of less than about 20 Å.

8. The method of claim 1, wherein the second plasma comprises nitrogen.

9. The method of claim 1, wherein the second plasma comprises an inert gas.

10. The method of claim 1, further comprising:
    thermally annealing the silicon oxide and silicon nitride layers.

11. The method of claim 1, wherein treating an upper surface of the silicon oxide layer with a plasma comprises:
    exposing the upper surface of the silicon oxide layer to a non-nitrogen containing plasma comprising an inert gas.

12. The method of claim 2, further comprising:
    removing a native oxide from the substrate before forming the silicon oxide layer.

13. The method of claim 3, wherein the plasma further comprises an inert gas.

14. The method of claim 5, wherein the power supply provides power at a pulse frequency of about 10 kHz.

15. The method of claim 11, wherein the inert gas comprises one or more of argon (Ar), helium (He), krypton (Kr), neon (Ne), or xenon (Xe).

16. A method of forming a dielectric layer on a substrate, comprising:
    providing a substrate comprising silicon;
    forming a silicon oxide layer on the substrate by annealing the substrate in an oxidizing atmosphere;
    treating an upper surface of the silicon oxide layer with a plasma;
    depositing a silicon nitride layer on the treated silicon oxide layer via atomic layer deposition at a temperature from about 300 degrees Celsius to about 700 degrees Celsius;
    exposing the silicon nitride layer to a plasma; and
    thermally annealing the silicon oxide and silicon nitride layers.

17. A method of forming a gate structure on a substrate, comprising:
    providing substrate having an exposed silicon oxide layer;

treating an upper surface of the silicon oxide layer with a plasma;

depositing a silicon nitride layer on the silicon oxide layer via atomic layer deposition at a temperature from about 300 degrees Celsius to about 700 degrees Celsius;

exposing the silicon nitride layer to a plasma comprising at least one of nitrogen ($N_2$), ammonia ($NH_3$), argon (Ar), helium (He), krypton (Kr), neon (Ne), or xenon (Xe); and forming a gate electrode layer above the silicon nitride layer.

18. The method of claim 17, wherein providing a substrate having an exposed silicon oxide layer comprises:

forming a silicon oxide layer on the substrate by annealing the substrate in an oxidizing atmosphere.

19. The method of claim 17, wherein treating an upper surface of the silicon oxide layer with a plasma comprises:

exposing the upper surface of the silicon oxide layer to a plasma comprising at least one of nitrogen ($N_2$), ammonia ($NH_3$), argon (Ar), helium (He), krypton (Kr), neon (Ne), or xenon (Xe).

20. The method of claim 17, further comprising:

thermally annealing the silicon oxide and silicon nitride layers.

21. The method of claim 17, further comprising:

forming a layer disposed between the silicon nitride layer and the gate electrode layer, the layer comprising at least two of silicon, oxygen, or aluminum.

22. The method of claim 17, wherein the gate electrode layer comprises polysilicon or tantalum.

* * * * *